United States Patent
Stevens (12)

(10) Patent No.: US 6,458,634 B1
(45) Date of Patent: Oct. 1, 2002

(54) REDUCTION OF INDUCED CHARGE IN SOI DEVICES DURING FOCUSED ION BEAM PROCESSING

(75) Inventor: Keith C. Stevens, Fairfield, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/681,505

(22) Filed: Apr. 18, 2001

(51) Int. Cl.[7] .............................................. H01L 21/304
(52) U.S. Cl. ........................ 438/149; 438/407; 438/423; 438/672; 438/690
(58) Field of Search ................................ 438/672, 669, 438/618, 149, 407, 423, 18, 690, 763

(56) References Cited

U.S. PATENT DOCUMENTS

| | | |
|---|---|---|
| 4,503,329 A | 3/1985 | Yamaguchi et al. |
| 4,639,301 A | 1/1987 | Doherty et al. |
| 4,992,661 A | 2/1991 | Tamura et al. |
| 5,306,601 A | 4/1994 | Hashimoto et al. |
| 5,357,116 A | 10/1994 | Talbot et al. |
| 5,747,803 A | 5/1998 | Doong |
| 5,786,231 A | * 7/1998 | Warren et al. ................. 438/17 |
| 5,922,179 A | 7/1999 | Mitro et al. |
| 5,977,543 A | 11/1999 | Ihn et al. |
| 6,074,886 A | * 6/2000 | Henaux ........................ 438/17 |
| 6,155,436 A | * 12/2000 | Smick et al. ............. 211/41.18 |

FOREIGN PATENT DOCUMENTS

JP  5-21539 A  * 1/1993

* cited by examiner

*Primary Examiner*—Olik Chaudhuri
*Assistant Examiner*—Stephen W. Smoot
(74) *Attorney, Agent, or Firm*—Scully, Scott, Murphy & Presser; Robert A. Walsh

(57) ABSTRACT

A method of substantially reducing charge build-up in a SOI device is provided. The method includes depositing a dielectric material on a surface of a semiconductor structure which includes at least silicon-on-insulator (SOI) devices therein. Next, a first conductive material is deposited on the dielectric material and then holes are drilled through the conductive material and the dielectric insulating material. Each hole is filled with a second conductive material, and thereafter selective portions of the first conductive material are removed to form contact pads for further probing. The method is especially useful in focused ion beam (FIB) drilling.

19 Claims, 2 Drawing Sheets

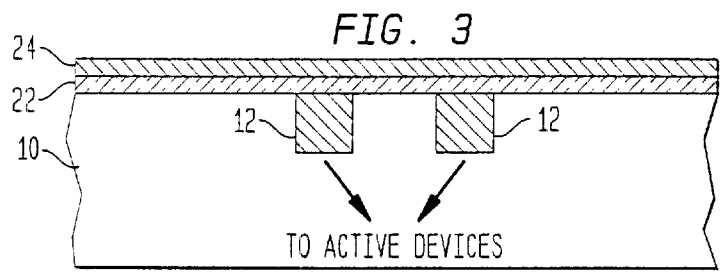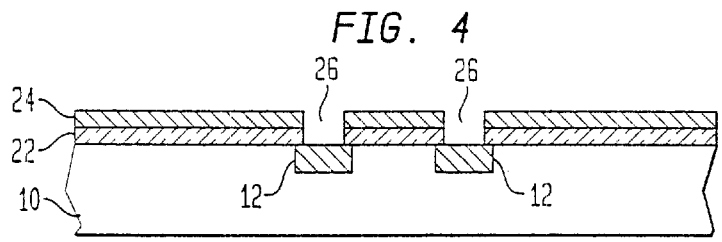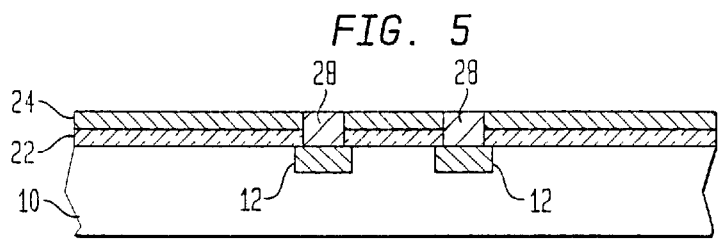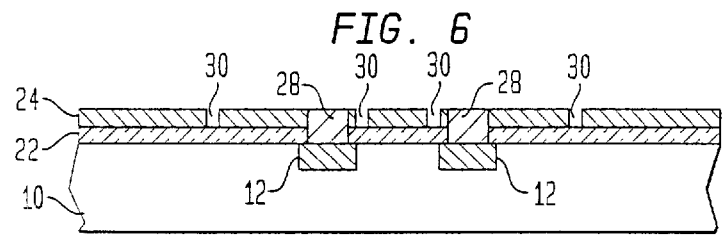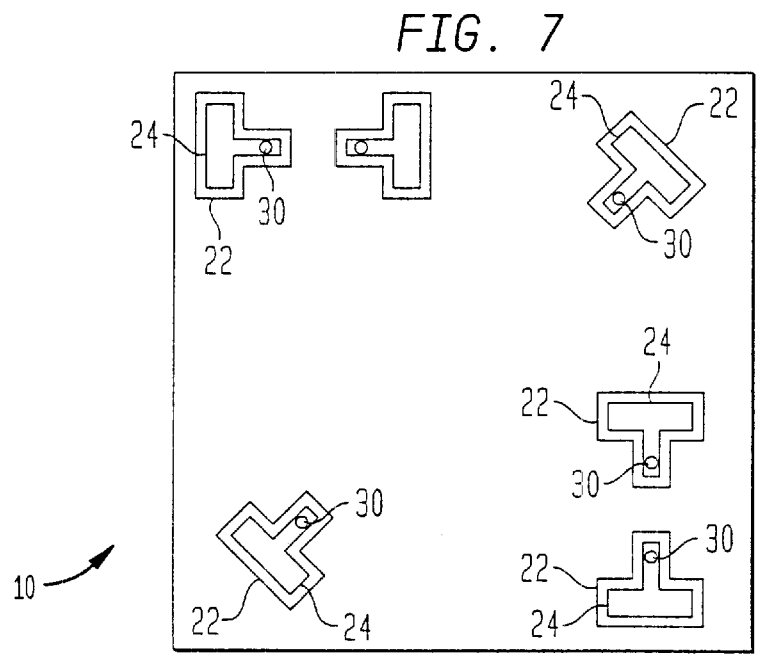

REDUCTION OF INDUCED CHARGE IN SOI DEVICES DURING FOCUSED ION BEAM PROCESSING

DETAILED DESCRIPTION OF THE INVENTION

1. Field of the Invention

The present invention relates to semiconductor devices, and more particularly to a method of substantially reducing charge build-up on silicon-on-insulator (SOI) devices during the fabrication of probe contacts on an interconnect structure in which SOI devices are embedded.

2. Background of the Invention

Focused ion beam (FIB) is a useful tool in preparing a device for characterization and/or diagnostic testing by fabricating contact pads at nodes of interest. Present FIB techniques can induce excessive charge on an SOI device, which the SOI device cannot tolerate due to the floating body nature of the SOI device. The excessive charge may induce temporary or permanent damage of the SOI device (especially of concern is the gate dielectric region of the device). Excessive charge induced by the FIB process may also destroy the very defect under investigation FIG. 1 identifies a typical cross-section of semiconductor structure 10 after prior art FIB processing. The semiconductor structure, which includes SOI devices (referred to as active devices in FIG. 1), has been planarized to the desired interconnect level. Reference numeral 12 represents the wiring region of the interconnect level and it represents the node of contact. Local oxide 14 is then deposited in the region where FIB pads 16 are to be formed. Next, a FIB tool is used to drill a hole in the local oxide to the desired node, i.e., point of contact. Finally, a conductive metal such as Al or Cu is deposited in the hole and atop of local oxide 14 to form pad 16 and via 18 to the node, i.e., wiring region 12 of the interconnect level of interest. During the drilling process, the FIB tool generates excessive charge. This excessive charge is coupled to the contact point when the oxide is removed during drilling. An underlying SOI device, due to its nature, cannot dissipate the excessive charge. FIG. 2 is a top-down view of the structure shown in FIG. 1.

In view of the excessive charge problem mentioned above with prior art FIB processes, there is a need for developing a new and improved method which is capable of sufficiently dissipating charge away from SOI devices during the formation of probe contacts.

SUMMARY OF THE INVENTION

The present invention provides a method which is capable of substantially reducing induced charge in SOI devices during a drilling step such as FIB. Specifically, the inventive method comprises the steps of:

(a) depositing a dielectric material on a surface of a semiconductor structure, said structure including at least silicon-on-insulator (SOI) devices;

(b) depositing a first conductive material on said dielectric material;

(c) drilling holes through said first conductive material and said dielectric material;

(d) filling said holes with a second conductive material; and (e) selectively removing portions of said first conductive material, stopping on said dielectric material.

In one embodiment of the present invention, the first conductive material is connected to a ground potential prior to and during drilling. In another embodiment of the present invention, an alignment process may be coupled with the drilling step. In yet another embodiment of the present invention, a dry etching step precedes the drilling step to enlarge the holes drilled into the first conductive material and the dielectric material.

BRIEF DESCRIPTION OF THE DRAWINGS

FIGS. 3–6 are cross-sectional views illustrating the basic processing steps of the present invention that are employed in forming a structure in which the charge is dissipated from the SOI devices.

FIG. 7 is a top-down view of the structure shown in FIG. 6.

DETAILED DESCRIPTION OF THE INVENTION

Figure 1:
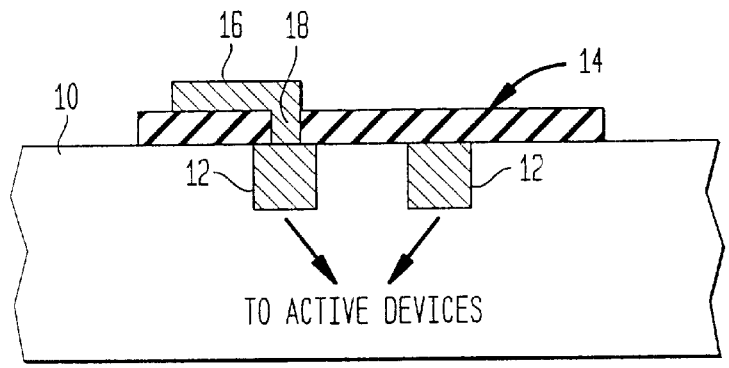
FIG. 1 is a cross-sectional view of a prior art structure which includes contact pads formed thereon by a FIB process.
Figure 2:
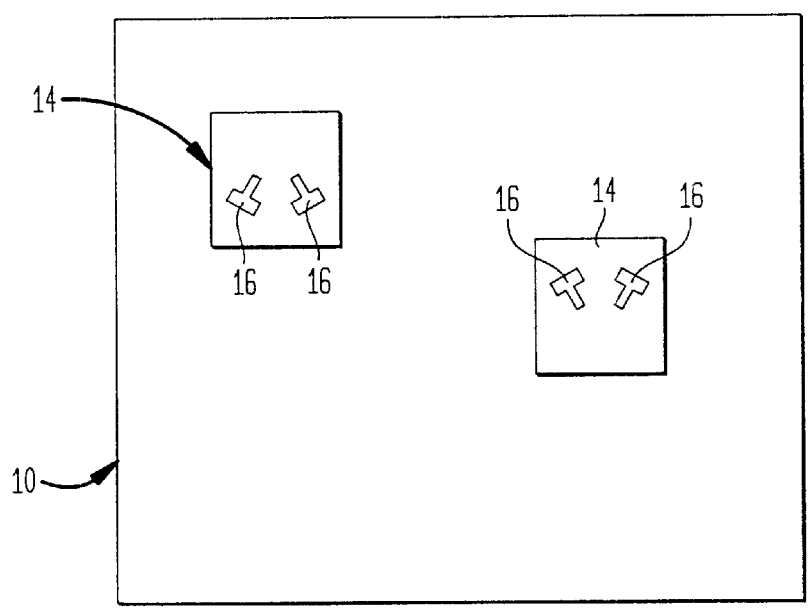
FIG. 2 is a top-down view of the structure shown in FIG. 1.

The present invention, which provides a method of substantially reducing charge build-up in SOI devices of a semiconductor structure, will now be described in more detail by referring to FIGS. 3–7. It is noted that in the accompanying drawings, like and/or corresponding elements are referred to by like reference numerals.

Reference is first made to FIG. 3 which shows an initial structure that is employed in the present invention. Specifically, the structure shown in FIG. 3 comprises semiconductor structure 10 which includes a semiconductor chip having at least SOI device regions (which are labeled as active devices in FIG. 3). Semiconductor structure 10 also includes one or more interconnect levels which comprise various via and wiring regions. In the drawings, reference numeral 12 refers to wiring regions of one of the interconnect levels present in the semiconductor structure. The structure shown in FIG. 3 also includes dielectric material 22 which is formed over the surface of semiconductor structure 10 and wiring regions 12. Semiconductor structure 10 also includes first conductive material 24 which is formed on top of dielectric material 22.

The structure shown in FIG. 3 is comprised of conventional materials well known to those skilled in the art and the structure is fabricated using conventional processing steps that are also well known in the art. For example, the semiconductor chip (including SOI devices) of the semiconductor structure is fabricated using conventional complementary metal oxide semiconductor (CMOS) processing steps and the interconnect levels are fabricated using conventional back-end-of-the-line (BEOL) processes such as damascene or dual damascene that are also well known in the art. Since such processes are well known in the art, a detailed description concerning the fabrication of the semiconductor structure including chip and interconnect levels is not needed herein. It is, however, emphasized that the active devices are formed in the thin Si-containing layer of a SOI substrate. Following fabrication of semiconductor structure 10, a conventional planarization process such as chemical-mechanical polishing (CMP) or grinding may be employed to provide a planar structure.

The interconnect level includes at least a metal wiring region that is composed of a conductive metal such as Cu, Al, W, Ti, Au, Pt, Pd and alloys thereof. Conventional dielectrics (not specifically labeled in the drawings) typically surround the metal wiring regions. For clarity, reference numeral 12 refers to the wiring regions in which contact with an external pad will be made.

Dielectric material 22 is then formed over semiconductor structure 10 using any conventional blanket deposition process including, but not limited to: chemical vapor deposition (CVD), plasma-assisted CVD, evaporation, sputtering, chemical solution deposition and atomic layer deposition (ALD). The thickness of the deposited dielectric material may vary depending on the type of dielectric as well as deposition process employed. Typically, however, dielectric material 22 has a thickness of from about 25 to about 2000 nm after deposition, with a thickness of about 1000 nm being more highly preferred.

Dielectric material 22 may be composed of an oxide, nitride, oxynitride, polyamide, parylene polymer, polystyrene, Si-containing polymer, aromatic thermosetting polymeric resin, or other like insulating material. The present invention also contemplates mixtures and/or multilayers of the aforementioned dielectric materials. Of the various insulating materials mentioned herein, it is preferred that dielectric material 22 be composed of an oxide such as $SiO_2$, $Ta_2O_5$, and $Al_2O_3$.

Next, first conductive material 24 is formed on top of dielectric material 22 utilizing a conventional deposition process including, but not limited to: CVD, plasma-assisted CVD, evaporation, sputtering, plating and other like deposition processes. The thickness of the deposited first conductive material may vary depending on the type of conductive material as well as deposition process employed. Typically, however, first conductive material 24 has a thickness of from about 100 to about 2000 nm after deposition, with a thickness of about 1000 nm being more highly preferred.

First conductive material 24 may be composed of the same or different conductive metal as wiring region 12. That is, first conductive material 24 may be composed of any conductive material such as Cu, Al, W, Ti, Au, Pt, Pd or alloys and/or multilayers thereof. Of the various conductive materials mentioned herein, it is preferred that first conductive material 24 is composed of a Cu or Al layer.

Following the deposition of dielectric material 22 and first conductive material 24, holes 26 are drilled through the deposited conductive material and the dielectric material stopping on wiring regions 12. The resultant structure formed after the drilling step is shown, for example, in FIG. 4. The drilling process includes conventional processes well known to those skilled in the art including, but not limited to: FIB, laser beam, bit drilling and other like drilling processes which are typically employed in this field. Of the various drilling methods mentioned above, it is highly preferred to use a FIB process.

To aid in the drilling process, an alignment process may be employed prior to and/or during drilling. Any conventional alignment process including a laser interferometer may be employed in the present invention.

The drilling process may be employed alone, or drilling can be used in conjunction with a conventional dry etch process such as reactive-ion etching, ion beam etching, or plasma etching. When a dry etching process is employed with the drilling process, the dry etching process typically precedes the drilling process. The dry etching process is employed in some instances to enlarge the size of the hole formed during drilling.

In order to further dissipate charge, first conductive material 24 is typically connected to a ground potential prior to and during the drilling step. The amount of excessive charge that an SOI device is subjected to during the drilling process is greatly reduced due to the dissipation of charge by first conductive material 24.

After drilling, each hole is filled with second conductive material 28 to form a via to the underlying wiring region. Second conductive material 28 is formed in the holes by utilizing a conventional deposition process such as CVD, plasma-assisted CVD, plating, sputtering, evaporation and the like, and if needed, a conventional planarization process such as CMP may follow the filling of the holes.

The second conductive material used to fill the holes is typically composed of the same or different conductive material as the wiring regions and/or the first conductive material. Thus, for example, second conductive material 24 may be composed of any conductive material such as Al, Cu, W, Ti, Au, Pt, Pd and alloys thereof. In a preferred embodiment of the present invention, the second conductive material is composed of the same material as wiring regions 12 and first conductive material 24. FIG. 5 shows the structure that is formed after the above filling process.

FIG. 6 and FIG. 7 illustrate the structure that is obtained after selective portions of first conductive material 24 have been removed so as to provide contact pads, i.e., probes, 30 in the structure. This step of the present invention includes the use of a conventional removal process including, but not limited to: FIB, conventional lithography and etching, laser etching and other like techniques which can form isolated contact pads in the first conductive material. The isolated contact pads may be employed in the present invention for further probing. Note also that during the selective removal process, the presence of the first conductive material dissipates the excessive charge from the SOI devices.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms described and illustrated herein, but fall within the scope of the appended claims.

What is claimed is:

1. A method of substantially reducing charge build-up in SOI devices comprising the steps of: (a) depositing a dielectric material on a surface of a semiconductor structure, said structure including at least silicon-on-insulator (SOI) devices; (b) depositing a first conductive material on said dielectric material; (c) drilling holes through said first conductive material and said dielectric material; (d) filling said holes with a second conductive material; and (e) selectively removing portions of said first conductive material, stopping on said dielectric material.

2. The method of claim 1 wherein said semiconductor structure further includes a semiconductor chip having one or more interconnect levels formed thereon.

3. The method of claim 2 wherein said interconnect levels include at least wiring regions.

4. The method of claim 1 wherein said dielectric material is an insulating material selected from the group consisting of oxides, nitrides, oxynitrides, polyamides, parylene polymers, polystyrene, Si-containing polymers, aromatic thermosetting polymeric resins and mixtures and/or multilayers thereof.

5. The method of claim 4 wherein said dielectric material is an oxide.

6. The method of claim 1 wherein said dielectric material is deposited by chemical vapor deposition (CVD), plasma-assisted CVD, evaporation, sputtering, chemical solution deposition or atomic layer deposition.

7. The method of claim 1 wherein said first conductive material is composed of Al, Cu, W, Ti, Au, Pt, Pd or alloys and/or multilayers thereof.

8. The method of claim 7 wherein said first conductive material is composed of Al or Cu.

9. The method of claim 1 wherein said first conductive material is deposited by CVD, plasma-assisted CVD, evaporation, sputtering or plating.

10. The method of claim 1 wherein said drilling step includes focus ion beam drilling, laser beam drilling or bit drilling.

11. The method of claim 10 wherein said drilling step comprises focus ion beam drilling.

12. The method of claim 1 wherein said first conductive material is connected to a ground potential during said drilling step.

13. The method of claim 1 wherein said drilling step is used in conjunction with an alignment process.

14. The method of claim 1 wherein a dry etching process precedes said drilling step to enlarge said holes.

15. The method of claim 14 wherein said dry etching process comprises reactive-ion etching, ion beam etching, or plasma etching.

16. The method of claim 1 wherein said holes expose wiring regions present in the underlying semiconductor structure.

17. The method of claim 1 wherein said filling step includes CVD, plasma-assisted CVD, sputtering, plating or evaporation.

18. The method of claim 1 wherein said second conductive material comprises Al, Cu, W, Ti, Au, Pt, Pd or alloys thereof.

19. The method of claim 1 wherein step (e) comprises focus ion beam etching, lithography and etching, or laser etching.

* * * * *